United States Patent
Servais et al.

[19]

[11] Patent Number: 6,141,388
[45] Date of Patent: Oct. 31, 2000

[54] RECEIVED SIGNAL QUALITY DETERMINATION METHOD AND SYSTEMS FOR CONVOLUTIONALLY ENCODED COMMUNICATION CHANNELS

[75] Inventors: Frederic Henri Servais; Phillip Marc Johnson, both of Raleigh, N.C.

[73] Assignee: Ericsson Inc., Research Triangle Park, N.C.

[21] Appl. No.: 09/038,602

[22] Filed: Mar. 11, 1998

[51] Int. Cl.[7] .................................................. H04L 23/02
[52] U.S. Cl. .......................... 375/262; 714/759; 375/265
[58] Field of Search ................................... 375/259, 262, 375/265; 714/756, 759, 780, 792, 795, 796

[56] References Cited

U.S. PATENT DOCUMENTS

| | | | |
|---|---|---|---|
| 5,349,589 | 9/1994 | Chennakeshu et al. | |
| 5,432,818 | 7/1995 | Lou | 375/324 |
| 5,442,646 | 8/1995 | Chadwick et al. | 714/795 |
| 5,541,955 | 7/1996 | Jacobsmeyer | 375/222 |
| 5,577,053 | 11/1996 | Dent | |
| 5,712,877 | 1/1998 | Ho et al. | 375/284 |
| 5,721,756 | 2/1998 | Liebetreu et al. | 35/344 |
| 5,754,599 | 5/1998 | Ling et al. | 375/340 |
| 5,841,817 | 11/1998 | Krieger et al. | 375/340 |
| 5,933,462 | 8/1999 | Viterbi | 375/141 |
| 5,942,003 | 8/1999 | Ivry | 714/762 |
| 5,996,112 | 11/1999 | Dabiri et al. | 714/795 |
| 6,034,996 | 3/2000 | Herzberg | 375/265 |

FOREIGN PATENT DOCUMENTS

| | | | |
|---|---|---|---|
| 0388163A2 | 9/1990 | European Pat. Off. | H04L 1/20 |
| 078227A2 | 7/1997 | European Pat. Off. | H04B 7/26 |
| 02202725 | 8/1990 | Japan. | |
| 2232854 | 12/1990 | United Kingdom | H04L 1/20 |
| 2 305 083 | 3/1997 | United Kingdom. | |
| WO96/26583 | 8/1996 | WIPO | H04L 1/20 |

OTHER PUBLICATIONS

International Search Report—PCT/US99/02646.
O. Collins, Determinate State Convolutional Codes, *IEEE Transactions on Communications*, vol. 41, No. 12 (Dec. 1993).
G. Clarke, Jr., *Error–Detection Coding for Digital Communications*, Appendix B, Plenum Press, New York (1981).
Lockheed Martin Corporation, Asia Cellular Satellite System SAIS, Rev. B, Mar. 1997.

*Primary Examiner*—Chi H. Pham
*Assistant Examiner*—Emmanuel Bayard
*Attorney, Agent, or Firm*—Myers Bigel Sibley & Sajovec

[57] ABSTRACT

Received signal quality (bit error rate) estimates for a communication channel are provided by a receiver apparatus which is connected to the communication channel and which includes a convolutional decoder providing an estimate of a transmitted data frame and an associated final decision metric. The bit error rate estimate is generated by a bit error rate estimation circuit which includes a memory containing values for mapping the final decision metric to a corresponding bit error rate estimate. The bit error rate estimate may be provided to a control node of the communication channel which may use the provided estimate to take a corrective action such as determining whether a handover to a different communication channel should be initiated based upon the bit error rate. The communication channel may be an allocated channel of a cellular radio communication network servicing a mobile terminal receiver apparatus with the control nodes being the base stations of the cellular network. The convolutional decoder may be a Viterbi decoder.

24 Claims, 7 Drawing Sheets

PLOT OF METRICS VS. BER

NODES

RECEIVED SIGNAL QUALITY DETERMINATION METHOD AND SYSTEMS FOR CONVOLUTIONALLY ENCODED COMMUNICATION CHANNELS

FIELD OF THE INVENTION

This invention relates to communication systems and more particularly to methods and systems for measuring received signal quality in such systems.

BACKGROUND OF THE INVENTION

Communication systems typically include at least one transmitter station (node) and one receiver station (node). In either a wired or wireless system, a signal sent from the transmitter to the receiver must be of sufficient magnitude (or strength) and quality to allow the information contained within the signal to be discriminated from the noise which is generally present on a communication channel in the system. This may be a greater problem within a wireless system which, typically, is more susceptible to noise from various interference sources. An example of a wireless system is a radio network such as a cellular network commonly utilized for voice and/or data communications between a fixed base station covering a geographic region and mobile devices such as cellular terminals (or phones) present in the covered region.

In data transmission over communication channels that may be prone to errors, such as those found within radio networks, error detection coding and/or error correction coding may be employed to reduce the errors in the data transmission. The data transmitted is often digital information, which includes messages composed of binary bits of information, where each bit can have a value of either a ONE or a ZERO. Any given message is then a string comprising a number of ONES interspersed with a number of ZEROES. It will be appreciated that any string of L bits can represent one of $2^L$ unique messages. The messages may represent digitized voice information or some other form of information.

Error detection coding and error correction coding may both be used in communication systems. A common error detection technique, the Cyclic Redundancy Check (CRC) technique, generates and appends to the message "check" bits that are calculated from the bits of the data message. The check bits constitute a "checkword" that is specific to a given message. The checkword may be appended to the message so that both are processed through the same encoder, both are transmitted through the communication channel together, and both are processed through the same decoder in the receiver.

A known error correction technique is convolutional coding. Convolutional codes differ from block codes in that the message bits are not explicitly contained within the transmitted bits. In convolutional coding, each message bit is converted to a symbol. The resulting symbol contains 'n' bits based on 'n' generator polynomials where each polynomial defines some Boolean combination of the current and previous message bits. The message bits are considered L bits at a time, and N=n*L bits are transmitted for every L message bits. The N bits are typically structured for transmission as a single frame (or packet). Frames can either be of a predetermined fixed length (number of bits) or a variable length. It is to be understood that while the term message as used herein will be used interchangeably with frame (or packet), a network higher layer "message" can extend across multiple frames or be contained in a single frame.

The known methods for convolutional decoding include threshold decoding, Sequential Maximum Likelihood Sequence Estimation (SMLSE), and the stack algorithm. The SMLSE technique is commonly known as the Viterbi algorithm, which is described in the literature including D. Forney, "The Viterbi Algorithm," Proc. IEEE, Vol. 61, pp. 268–278 (March, 1973).

An SMLSE algorithm generates a path metric which may be considered a confidence factor representing the degree of correlation between a postulated bit sequence and an actual (e.g., received) bit sequence. To the extent that the postulated and actual bit sequences agree, the path metric varies to reflect the confidence associated with that postulated bit sequence. It will be understood that "postulated bit sequence," or simply "postulate," refers generally to any possible bit sequence having some probability of being the actual bit sequence of interest.

In one variation of the SMLSE algorithm, the received encoded bits are characterized not just by their bit polarities, but by a magnitude or quality measure representing the degree of "ONE-ness" or ZERO-ness." When a "strong" received symbol matches a locally predicted symbol, the confidence factor for the path is increased significantly whereas a "weak" received symbol would increase the confidence factor to a lesser extent. A received symbol which does not match the locally predicted symbol will decrease the confidence factor of the corresponding path with the amount of decrease determined by the "strength" of the mismatching received symbol. This is typically referred to as "soft" decoding as opposed to "hard" decoding.

An SMLSE Viterbi decoder determines the sequence of possibly transmitted data bits that most closely matches the received signal. The Viterbi algorithm allows the best sequence to be determined successively thus avoiding the need to test all two-to-the power of L possible sequences. To establish a starting point for the successive determinations, the encoder is typically initialized to a known starting state before feeding in data bits. In this case, there is only one allowed initial state for the decoder. The number of valid states then doubles at each successive step up to two to the power of the (code constraint length–1). After this point, for a 1/n code, the number of possible paths doubles each time a new unknown bit is postulated but immediately halves again due to an earlier-hypothesized bit now being decided to one of two specific values (this ratio may vary in the more general case of a k/n code). The number of states thus remains constant until the last unknown data bit is hypothesized. Then, typically, known bits are fed into the encoder to flush through the last data bit. The receiver decoder knows a priori what this terminal state will be and each time one more undecided data bit is flushed out of the encoder, the number of possible remaining valid states halves until it becomes a single state. This method of terminating a convolutional block encoder by down tapering to a single end state is called "using tail bits."

In addition to error detection and error correction coding techniques, certain types of communication networks, such as cellular radio communication networks, may change the allocated channel for a communication to ensure an adequate communication channel. This change may provide for handover to a different base station or a change in the channel (for example, a different frequency) without a handover to a different base station. To support channel decision making in such systems, a received signal quality measure (typically quantified as a bit error rate) is utilized to characterize the performance of a communication channel on the network.

Various approaches have been suggested for calculating a received signal quality measurement. One common approach is based upon measurements of Received Signal Strength ("RSS"). A cellular phone typically includes a radio receiver including an antenna for receiving signals and an amplifier/detector for generating a measure of the strength of received signals. Cellular phones using a Time Division Multiple Access ("TDMA") method conforming to either the European cellular standard known as GSM or either of the American TDMA standards known respectively as D-AMPS or PCS1900 use spare time between transmit and receive timeslots to change frequency and monitor the signal strengths of other base stations. Several measurements of RSS are typically averaged for the same base station. The averages are reported to the currently serving base station, which determines if a handover should be made to another, stronger base station. Determination of average RSS can comprise performing a series of measurements that are digitized at the sampling rate of an analog to digital converter which is used for demodulating traffic symbols, i.e., the sampling rate may be one or more times the traffic symbol rate. The measurements are preferably averaged over a TDMA timeslot or other measurement window in order to reduce the effects of fading and noise.

However, this approach to characterizing received signal quality may produce inaccurate results in an environment where multiple transmissions may be occurring. Specifically, the RSS includes the desired signal, adjacent channel interfering signals, co-channel interfering signals from neighboring cells, and noise. The non-desirous interferers may cause a high RSS reading under conditions when the actual bit error rate is high.

Two other techniques have been suggested for use on communication channels using convolutional encoding as the mechanism for bit error correction of transmitted signals. One known approach to bit error rate calculation in such a device is to recode the corrected received signal and compare the recoded signal to the uncorrected signal to calculate a bit error rate based on differences between the re-encoded and the received bit pattern. An example of such a recoding approach to bit error rate calculation is illustrated in Great Britain Patent No. 2305083. This method typically works best whenever the decoder successfully decodes all the received bits, i.e., when the bit error rate is low enough for the error correction code to correct any errors.

An alternative approach, which avoids the requirement for recoding of received signals to generate a bit error rate, is disclosed in International Publication No. WO96/26583. This application suggests retaining the soft decision metrics at each step in the Viterbi decoder trellis, converting these individual decision metrics from an integer format into a floating point format and storing them in a memory unit. A trace back step is then performed to trace the state transitions in the trellis diagram in the reverse order. The sum of the absolute value of the stored soft decision variables in the correct path and the minimum value of the absolute values of the decision variables in the corresponding path are calculated. The sum of the decision variables in the correct path is averaged over a measurement period and compared to set threshold values to determine the bit error rate. This approach avoids the problem of re-encoding but has the disadvantage of requiring storage of metric values for each decision step in the trellis diagram and increased computational complexity for generating average decision values.

SUMMARY OF THE INVENTION

It is, therefore, an object of the present invention to provide improved communication systems and methods providing a measure of received signal quality.

It is a further object of the present invention to provide a bit error rate measure for communication channels utilizing convolutional coding for bit error correction.

It is a further object of the present invention to provide such systems and methods which provide improved estimates of bit error rate with reduced computational load and which provide such estimates over a range of error rates.

The communications systems and methods of the present invention utilize the final decision metric for a transmitted frame (or packet) of convolutionally encoded bits from the convolutional decoder of the receiver station. The final decision metric for this selected path, in addition to being utilized by the decoder, is passed to the bit error rate estimation circuitry of the present invention where it is mapped to provide a bit error rate estimate. The mapping is preferably provided by a look-up table containing predetermined values stored in the receiver station based on simulated test patterns at a variety of signal-to-noise ratios corresponding to the specified requirements of the communication network. According to various embodiments of the present invention, the final decision metrics from the decoder may be averaged across a measurement window size before mapping or, alternatively, each metric may be mapped to a bit error rate estimation and these estimates may be averaged over a selected sampling window to arrive at an average bit error rate estimate for transmission to a control node on the network.

In one embodiment of the present invention, methods and apparatus are provided for estimating a received signal quality for a communication channel. A data frame is convolutionally encoded. The encoded data frame is then transmitted over the communication channel by a terminal (or node). The transmitted data frame is received at a receiver station. The receiver station decodes the received data frame to provide an estimate of the transmitted data frame and an associated metric. Finally, the metric is mapped to provide the received signal quality estimate which may be a bit error rate estimate.

In another embodiment of the present invention, the bit error rate estimate is provided to a control node associated with the communication channel. The control node determines whether a different communication channel should be used for a subsequently transmitted data frame based on the bit error rate estimate. Alternatively, the control node may take other corrective actions such as controlling its transmitter to adjust the power of the transmitted signal or adjusting the strength of a Forward Error Correction (FEC).

In a further embodiment of the present invention, the decoding operations are repeated for a plurality of received data frames to provide a plurality of associated metrics. The plurality of associated metrics are averaged and the averaged plurality of associated metrics are mapped, for example through a look-up table, to provide the bit error rate estimate. Alternatively, this averaging may be provided by averaging a plurality of bit error rate estimates from a plurality of data frames to provide an averaged bit error estimate. The averaged bit error rate estimate is then provided to a control node associated with the communication channel.

The methods and apparatus of the present invention may be beneficially utilized where the communication channel is a radio communication channel and the control node is a terrestrial (base) or satellite station.

In a further aspect of the present invention a receiver apparatus is provided. The apparatus includes a receiver connected to a communication channel. A convolutional decoder is coupled to the receiver. The convolutional decoder provides an estimate of transmitted data from a received data frame and an associated metric for the estimate of transmitted data. Estimation means connected to the decoder provide an estimate of bit error rate based on the associated metric. The convolutional decoder in one embodiment is a Viterbi decoder. A storage means is provided for the estimation means which stores reference values for converting the associated metric to a corresponding bit error rate estimate for the communication channel. A controller is provided for mapping the associated metric to the stored reference values and for averaging associated metrics or bit error rate estimates. The reference values may be predefined and stored in the storage means which may be a non-volatile memory device.

Accordingly, the present invention provides for systems and methods for determining estimates of bit error rate which utilize calculated values which are necessarily created in connection with the receiver station bit error correction decoding methodology. A bit error rate estimate is thereby provided with reduced computational and circuit complexity, reduced memory requirements, and reduced load for the receiver station. This is particularly beneficial for mobile type receiver stations, such as mobile terminals, which must often operate for extended periods on battery power and which contain limited memory.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
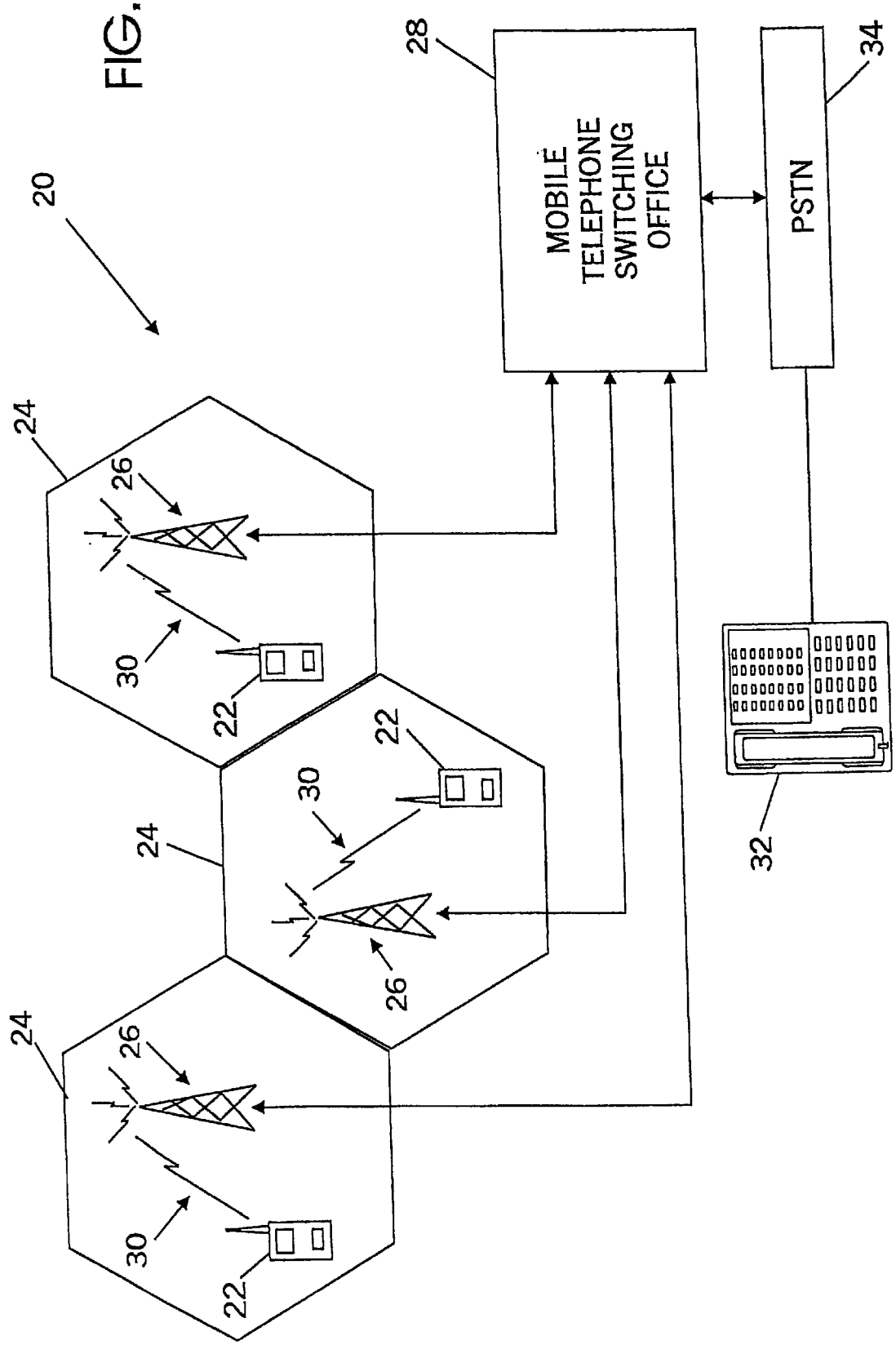
FIG. 1 schematically illustrates a terrestrial cellular wireless communication network according to the present invention.

For purposes of describing the present invention, the following discussion will be directed to a wireless communication network, in particular, a terrestrial cellular network such as a cellular telephone network. However, it is to be understood that the present invention may also be utilized in satellite based wireless networks or in wired networks which utilize convolutional coding of transmitted information. FIG. 1 illustrates a terrestrial wireless communication network 20 implementing the bit error rate determination systems and methods of the present invention. Network 20 may implement a variety of different protocols for communications, such as D-AMPS or GSM. However, in accordance with the teachings of the present invention, the protocol for network 20 includes convolutional error correction coding of data for transmission. The wireless system may include one or more wireless mobile terminals 22 that communicate with a plurality of cells 24 served by base stations 26 and a mobile telephone switching office (MTSO) 28. Although only three cells 24 are shown in FIG. 1, a typical cellular radiotelephone network may comprise hundreds of cells, and may include more than one MTSO 28 and may serve thousands of wireless mobile terminals 22.

The cells 24 generally serve discrete geographic regions in the communication network 20, from which links (or traffic channels) are established between wireless mobile terminals 22 and a MTSO 28, by way of the base stations 26 servicing the cells 24. Each cell 24 will have allocated to it one or more dedicated control channels and one or more traffic channels. The control channel is a dedicated channel used for transmitting cell identification and paging information. The traffic channels carry the voice and/or data information. Through the communication network 20, a duplex radio communication link (channel) 30 may be effected between two wireless mobile terminals 22 or between a wireless mobile terminal 22 and a landline telephone user 32 via a public switched telephone network (PSTN) 34. The function of the base station 26 is commonly to handle the radio communications between the cell 24 and the wireless mobile terminal 22. In this capacity, the base station 26 functions chiefly as a relay station for data and voice signals.

As is also illustrated in FIG. 1, mobile terminal 22 may establish a communication channel routed through any one of base stations 26 each of which define a node on communications network 20. According to the teachings of the present invention, mobile terminals 22 periodically provide a bit error rate estimate to whichever base station 26 is currently communicating with the mobile terminal. Base station 26 may then pass this information to mobile telephone switching office 28. MTSO 28 then determines whether to handover the communication underway to a different base station within network 20 or to take other corrective actions. Such other corrective actions may include controlling its transmitter to adjust the power of the transmitted signal or adjusting the strength of a Forward Error Correction (FEC). Alternately, this determination may be performed by base stations 26 or mobile terminals 22 depending on the mechanisms for such corrective actions provided by a particular network 20. The particulars of the bit error rate determination for use in deciding on a corrective action according to the present invention will now be further described with respect to the remaining figures.

Figure 2:
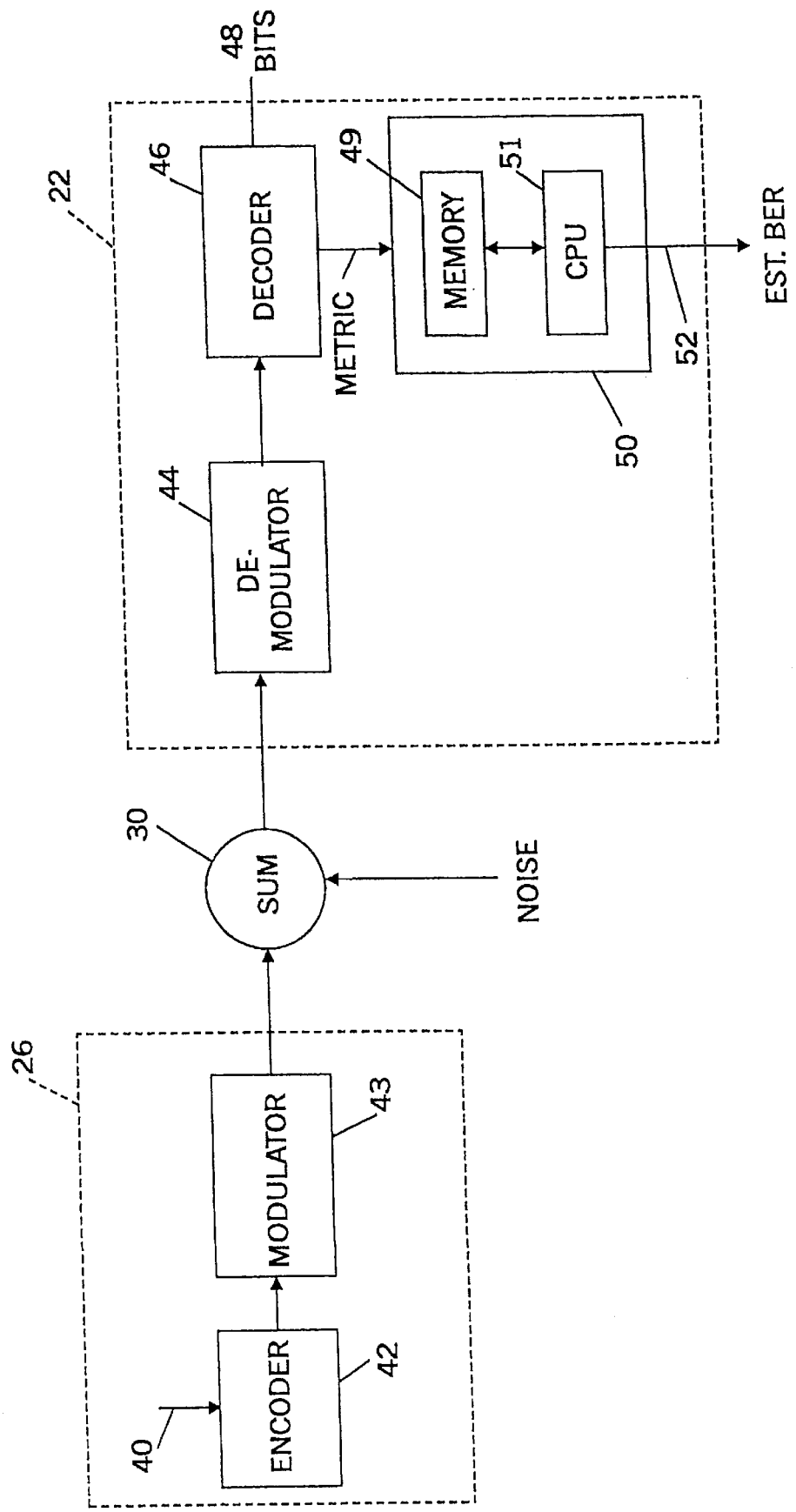
FIG. 2 is a block diagram which illustrates a communication system including a bit error rate estimation capability according to an embodiment of the present invention.

Referring now to FIG. 2, a schematic block diagram is shown illustrating an embodiment of a system according to the present invention. As shown in FIG. 2, digitized bits of data/voice/message information 40 are provided to convolutional encoder 42. As illustrated in FIG. 2, convolutional encoder 42 can be contained within base station 26. However, it is to be understood that, for two-way communications, the functions of transmit and receive as shown in FIG. 2 are both provided in mobile terminal 22 and base station 26 and that the operations for providing a received signal quality estimate according to the present invention may be implemented in either or both types of devices. It is further to be understood that base station 26 and mobile terminal 22 include additional circuitry for processing signals and transmitting such signals over communication channel 30 such as receivers and transmitters (including antennas) and modulators and demodulators all of which are known to those of ordinary skill in the art and will not be described further herein. Encoded bits from convolutional encoder 42 are provided to modulator 43 to be transmitted by base station 26 over network 30 as shown in FIG. 2. Network channel 30 is subject to channel impairments as schematically illustrated by the noise input to the summation node shown in FIG. 2.

The signal from network channel 30 is received at mobile terminal 22 where it is demodulated by demodulator 44. The demodulated bits are then provided to convolutional decoder 46 for error correction decoding. In addition to outputting a decoded (and error corrected) data bit stream 48 which is provided to further signal processing circuitry of mobile terminal 22, convolutional decoder 46 provides the final decision metric for each received frame to bit error rate determination circuit 50. Bit error rate determination circuit 50 maps the final decision metric and outputs an estimated bit error rate 52.

Figure 3:
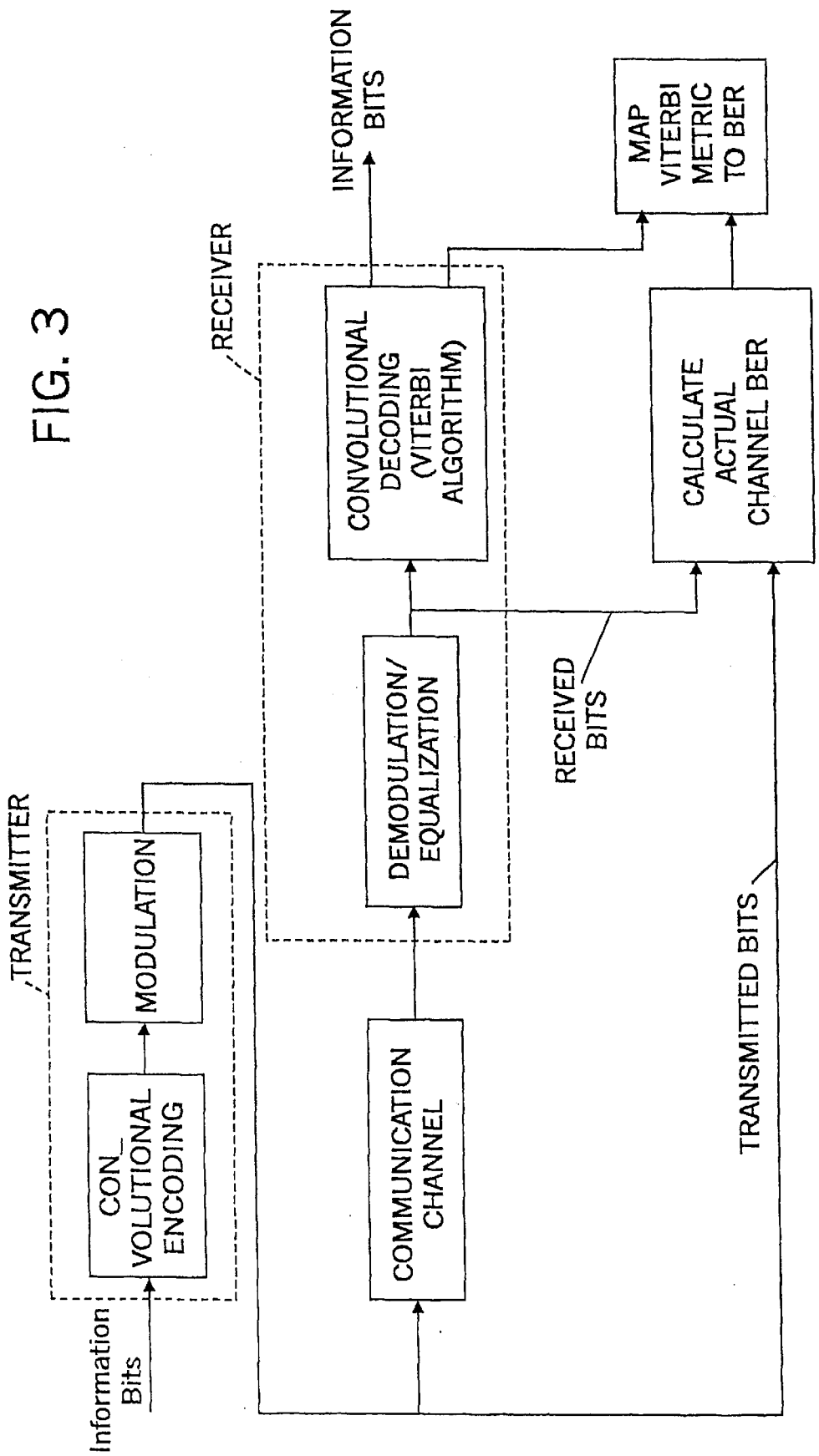
FIG. 3 is a block diagram which illustrates a training system for developing a mapping table for use according to one embodiment of the present invention.
Figure 4:
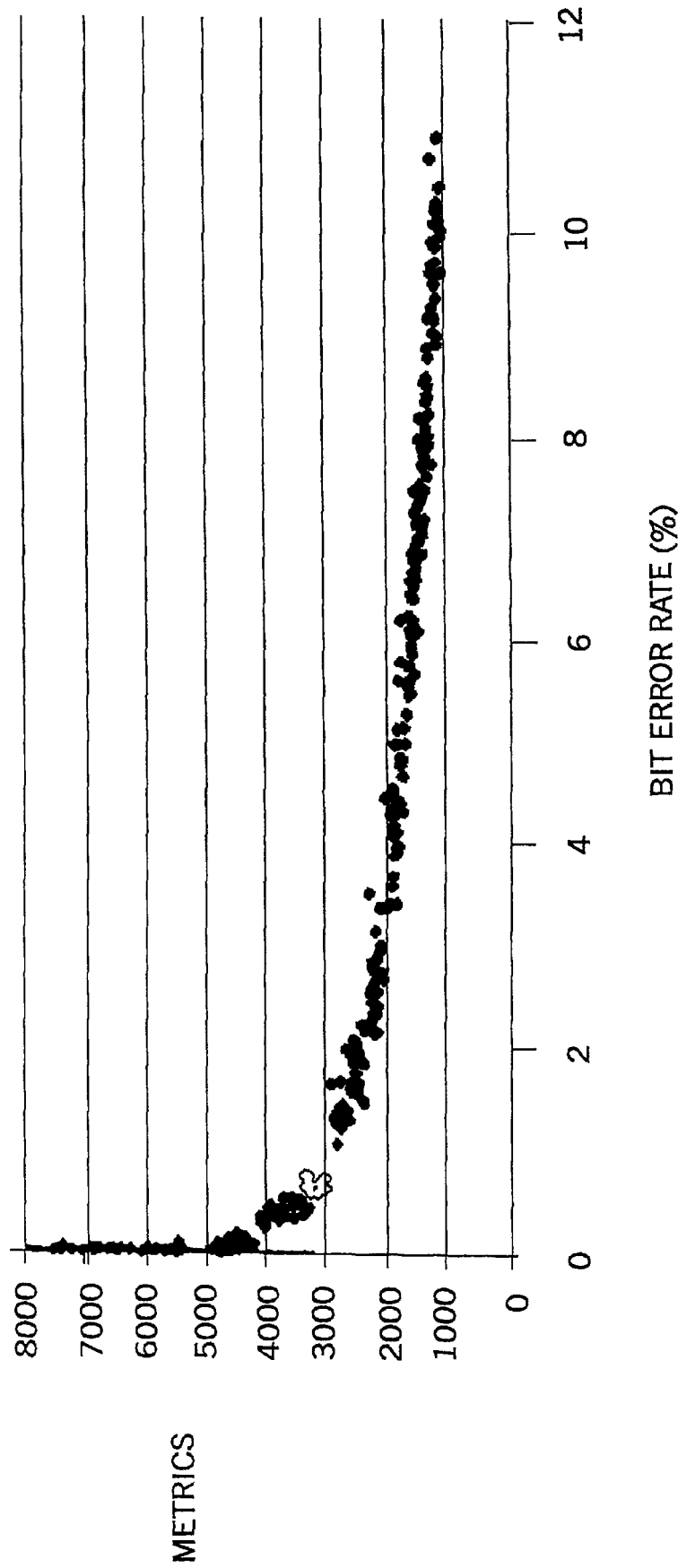
FIG. 4 is a graph of bit error rate versus metric for an embodiment of the present invention.

As illustrated in FIG. 2, bit error rate estimation circuit 50 includes nonvolatile memory 49 or other storage means and controller 51. Mapping values for converting final decision metrics to bit error rate estimate values are contained in memory 49. These values may be determined based on testing patterns generated in a laboratory environment. For example, known bit patterns can be repeatedly processed in a controlled environment where different signal to noise ratios can be selectively imposed on the transmission utilizing a test configuration such as that illustrated in FIG. 3. Various signal to noise ratios in turn typically correspond to specific bit error rate values. A graph of bit error rate versus final decision metric for a particular hardware configuration as determined under laboratory conditions is shown in FIG. 4. Moreover, by utilizing a controlled laboratory environment, the undecoded (i.e., no error correction operations performed) bit patterns can be compared to the known data patterns transmitted over a network in which noise is being induced and a direct count comparison can be made over a selected time period to provide an actual count of errors before error correction decoding. This fixed error count may then be correlated to the output final metric from the convolutional decoding circuit to generate the look-up table for storage in memory 49.

Referring again to FIG. 2, controller 51 provides means for receiving a metric from convolutional decoder 46 and for using the received metric to access memory 49 to generate a bit error rate estimate. Alternatively, rather than utilize a table look from memory 49, controller 51 may utilize the metric from convolutional decoder 46 as an input to a function to calculate and output the bit error rate estimate. For example, a low order polynomial could be evaluated by controller 51 to arrive at the estimate. The coefficients of the polynomial expression could be determined in advance using a least squares method based upon laboratory data such as that illustrated in FIG. 4. Controller 51 further provides means for averaging a plurality of input metrics or a plurality of output bit error rate estimates to provide average values of each of these parameters for use with various embodiments of the present invention.

Figure 5A:
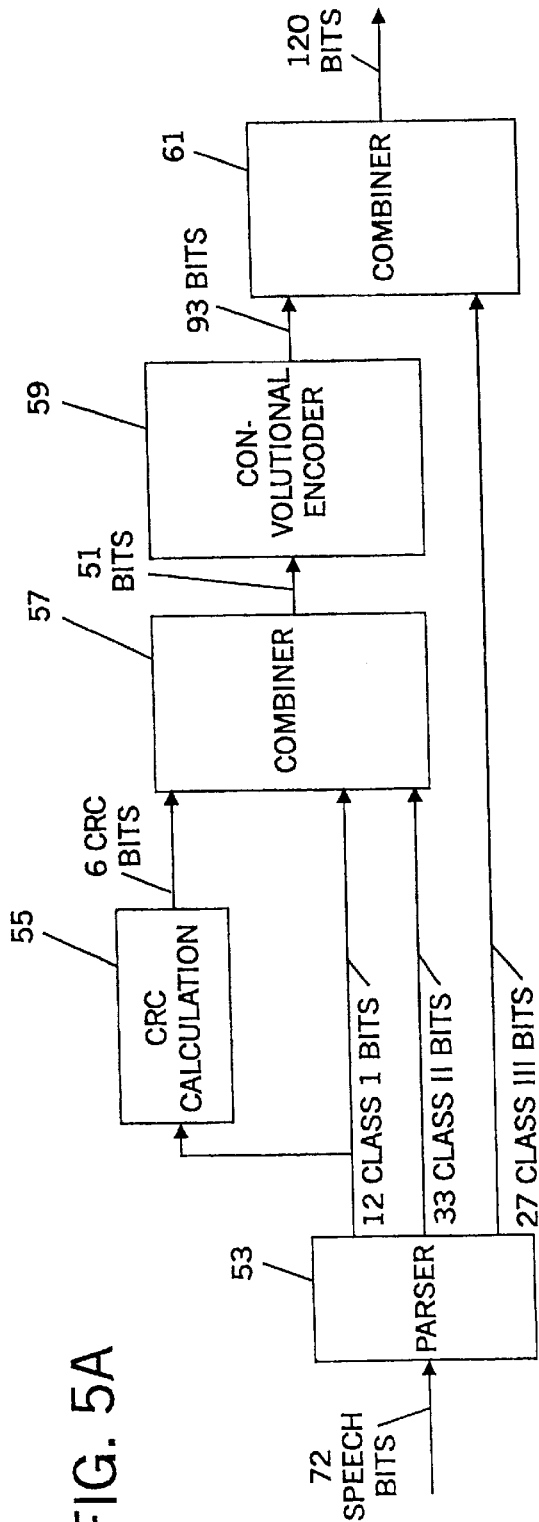
FIG. 5A is a block diagram which illustrates a receiver for a communication system according to an embodiment of the present invention.
Figure 5B:
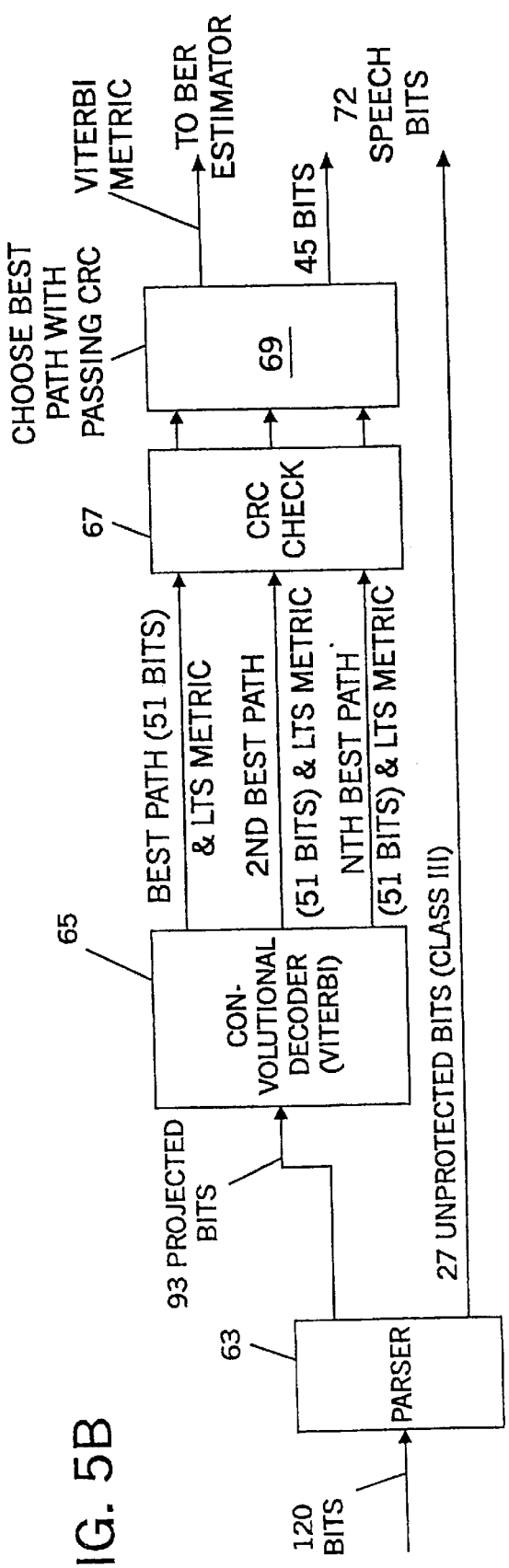
FIG. 5B is a block diagram which illustrates the transmitter for the communication system of FIG. 5A.

Referring now to FIGS. 5A and 5B, a schematic block diagram is shown illustrating another embodiment of a system according to the present invention in a Satellite Air Interface Specification (SAIS) based communication system. FIG. 5A illustrates system components on the transmit side generating, in the illustrated embodiment, 120 bits which are received and processed according to the present invention as illustrated in FIG. 5B. As is clear from the description of FIGS. 5A–B which follows, the operations and benefits of the present invention may be realized with a variety of encoding methodologies so long as a convolutional coding methodology generating a final decision metric is provided. Referring now to FIG. 5A, which represents an embodiment in a data communication system transmitting voice information in which 72 bits are utilized to represent a speech frame, parser 53 divides the 72 bits into twelve class I (most important), 33 class II and 27 class III (least important) bits. The twelve class I bits are CRC encoded by CRC calculation encoder 55 which results in 6 additional bits representing the CRC code for the twelve class I bits. The now 18 bits based on the class I bits are appended to the 33 class II bits by combiner 57 to provide 51 bits. The 51 bits from combiner 57 are convolutionally encoded by encoder 59 to provide 93 encoded bits before transmission. As illustrated in FIG. 5A, the convolutional code is a rate ½ code which has been punctured to affect a rate $^{51}\!/_{93}$. The 27 class III bits in the embodiment of FIG. 5A are not encoded. The 93 bits from encoder 59 are then combined with the 27 class III bits in combiner 61 to provide 120 bits for transmission over the communications channel.

On the receive end, as illustrated in FIG. 5B, the 120 bits are divided out by parser 63 to provide the 93 protected bits separated from the 27 unprotected class III bits. The 93 protected bits are then passed to convolutional decoder 65 for decoding. Unlike the previously described embodiment of FIG. 2, multiple path metrics are maintained and considered as candidate metrics for generating a bit error rate estimate in the embodiment of FIG. 5B. This additional feature is advantageous, for example, in systems where the speech is not played if an invalid CRC is detected. In such a system, if an invalid CRC is detected for the first selected bit path from the decoder, the frame is marked as bad and not sent to the speech decoder.

As illustrated in the embodiment of FIG. 5B, the present invention may also be used in communication systems in which the speech frame is not discarded based upon a CRC failure in the first selected bit path from the convolutional decoder. As shown in FIG. 5B, convolutional decoder 65 provides the output best path and its associated metric as well as additional paths in a descending order from the best path. For example, if the final decision metric associates the closest correlation with the highest metric value, the possible bit paths from the convolutional decoder are provided with the highest metric first followed by the second highest metric and so on until the Nth highest metric is output to CRC check circuit 67. The maximum number of alternative best path decisions corresponds to value N where N corresponds to the number of states in the decoder. The best bit path which has a CRC which is determined to be valid by CRC check circuit 67 is then selected by selection circuit 69. According to the illustrated embodiment of the present invention, in such a system the final decision metric of the path selected by circuit 69 is then used as the input to bit error rate determination circuit 50. The illustrated embodiment of FIGS. 5A and 5B is particularly useful in systems with known frame lengths not requiring tail bits to force the Viterbi decoder to a known end state.

For the discussion of the illustrated embodiment of FIGS. 5A–B, only voice frames were discussed, however, it is to be understood that, on various communication networks, both voice frames and control frames such a Fast Associated Control Channel (FACCH) frames may be sent on the same physical channel. A received traffic frame may therefore be either voice or FACCH and must preferably be checked against both. Therefore, each frame may be convolutionally decoded as if it were FACCH and then convolutionally decoded as if it were voice (voice and FACCH typically have different convolutional codes in known systems). In estimating received signal quality according to the methods of the present invention, the Viterbi final decision metric from either the voice channel decode or the FACCH channel decode may then be selected for mapping. As most frames are typically voice, according to one embodiment of the present invention, all frames are treated as voice and the voice channel decode metric is used for generating the received signal quality estimate. In an alternative embodiment, both the voice and FACCH decode metrics are evaluated and compared and the better metric is selected for generating the received signal quality estimate.

As will be appreciated by those of skill in the art, the above described aspects of the present invention in FIGS. 2, 3, 5A and 5B may be provided by hardware, software, or a combination of the above. While various components of the apparatus of the present invention have been illustrated in part as discrete elements in the Figure, they may, in practice, be implemented by a microcontroller including input and output ports and running software code, by custom or hybrid chips, by discrete components or by a combination of the above. In particular, memory 49 and controller 51 may be implemented as a segment of existing memory and additional code executing on an existing control means of terminal 22 respectively.

Figure 6:
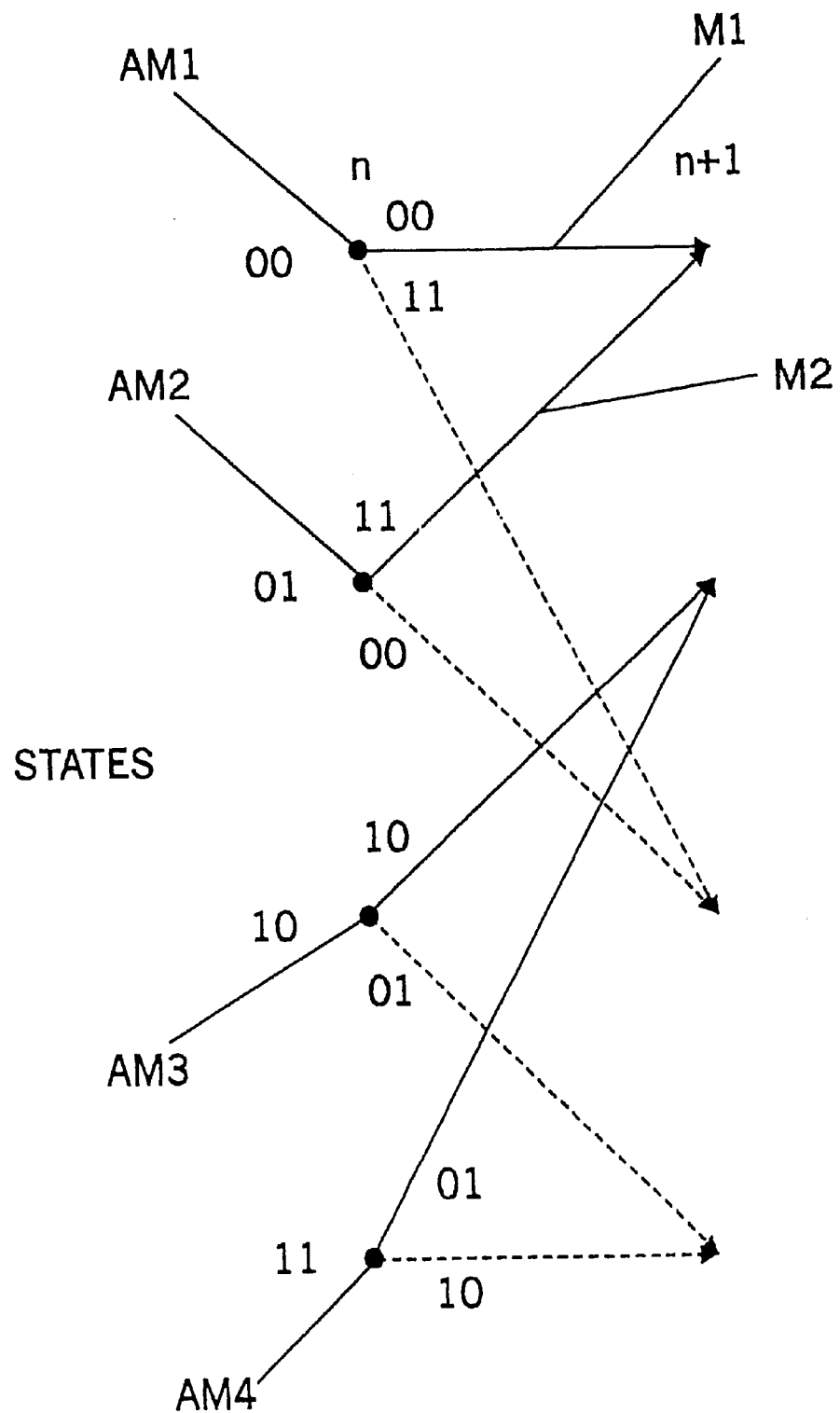
FIG. 6 graphically illustrates operations of a convolutional decoder algorithm generating a final decision metric suitable for use according to the teachings of the present invention.

Referring now to FIG. 6, operations for generating the final decision metric which is converted to provide a bit error rate estimate according to the teachings of the present invention will be illustrated with reference to a simple four state convolutional decoding trellis diagram. As shown in FIG. 6, each of the rows in the trellis represents a bit state before shifting in of the next bit hypothesis with each row successively representing states 00, 01, 10 and 11. Each of the columns of the trellis in FIG. 6 represents an individual bit node along the path of the decoding trellis. It is to be understood that, at the end of the trellis, a decision is made which selects a single path and tracing the selected path back through the trellis provides the sequence of bits within the frame which is the most likely estimate of the transmitted bits.

The transition forward through the trellis from each column shows a solid and a dotted line from each state node representing the 0 and 1 next bit hypothesis respectively. For example, starting in the upper left most node, a 00 with a hypothesis of the next shifted bit of 0 is illustrated by the solid line straight across to the 00 state node in the second column of the trellis. Similarly, a hypothesis of the next bit being a 1 is shown by a dotted line transitioning from state 00 to state 10 after the hypothesized 1 bit is shifted in and the 0 bit is shifted out.

At each node, there is a single accepted path which led to that node which path has an accumulated metric illustrated as AM1, AM2, AM3 and AM4 respectively in the first column. Each respective hypothetical bit change to the next column has an individual metric as shown for the 2 possible paths leading to state 00 in the second column. These individual metrics are shown as M1 for the 00 to 00 state path and M2 for the 01 to 00 state path. As described in the background section, in a Viterbi trellis diagram, half of the states are discarded at each step of the path decoding (i.e., each column of FIG. 6). Accordingly, the sum of AM1 plus M1 is compared to the sum of AM2 plus M2 to determine the cumulative metric for the two optional paths. A more likely correct path is then selected with the alternate path being discarded. Depending on the algorithm used, either the larger or smaller metric may represent the likely or correct path. Each node in the second column of FIG. 6 will then end up with a single accumulated metric for that node with 4 of the 8 possible paths discarded.

This process repeats itself bit decision by bit decision until the last bit of a frame to be decoded has been processed by the decoder (which corresponds to the right most column of nodes in FIG. 6). For the illustrated embodiment of FIG. 6, the convolutional decoder has four possible metrics corresponding to the four remaining path choices available at this point in time. Based on the remaining four accumulated metrics, one metric is selected as the final decision metric corresponding to the one of the four remaining paths which is the most likely correct path. It is this final decision metric which is provided by convolutional decoder 46 to bit error rate estimation circuit 50 according to the teachings of the present invention.

Figure 7:
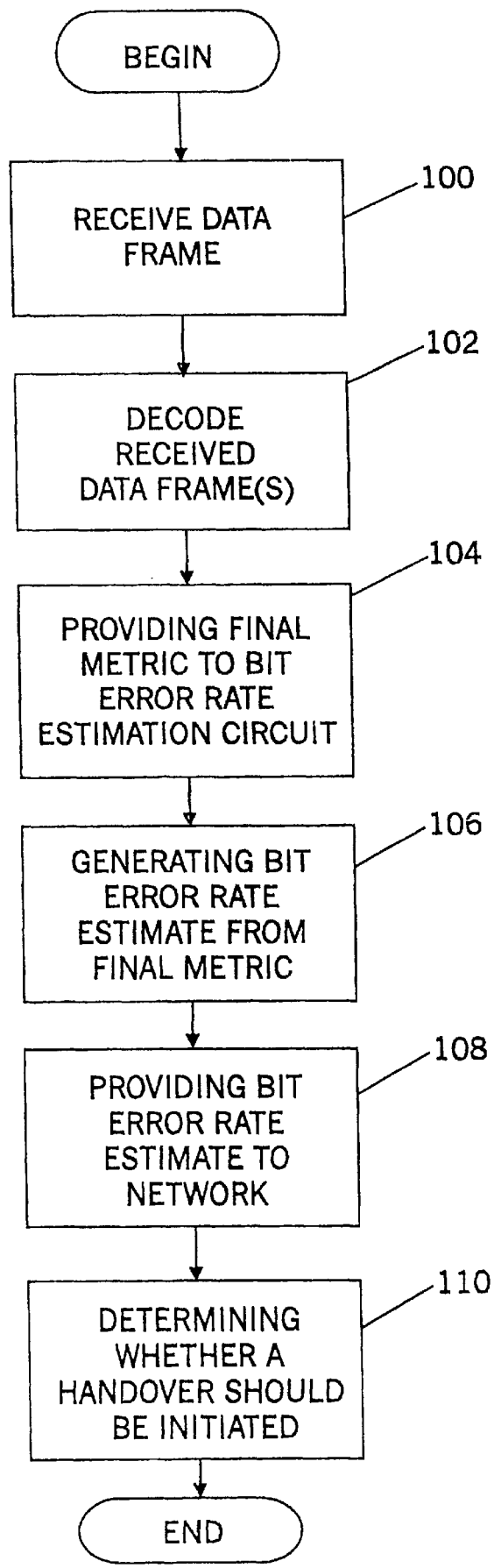
FIG. 7 is a flowchart illustrating operations of a terminal for communicating over a communication channel according to an embodiment of the present invention.

Referring now to the flowchart illustration of FIG. 7, operations according to the present invention will now be described. At block 100, a data frame or packet is received by mobile terminal 22. For purposes of the present invention, a frame or packet is a single block of bits to be decoded. As described in the background section above, the frame length would correspond to the parameter N of an SMLSE decoder which may either be a fixed or variable value. At block 102, the received data frame is decoded by decoder 46. In various embodiments of the present invention, a plurality of data frames are decoded to provide a plurality of final decision metrics associated with the selected bit pattern from each frame output by decoder 46. At block 104, the final metric (or average metric from a plurality of decoded frames) is provided to bit error rate estimation circuit 50. Averaging of either final decision metrics or bit error rate estimates may be provided by using a moving average routine, an autoregressive routine or a combination autoregressive moving average routine or other known routines for calculating averages.

At block 106, a bit error rate estimate is generated from the final metric by mapping the metric value to a corresponding bit error rate value. This mapping operation accommodates nonlinearity in the relationship between bit error rate and the final decision metric from the decoder. As described previously, this mapping may be made by a table look-up using the final metric as the input value and reading a value from a table in memory to output a corresponding value for the bit error rate estimate. The mapping operation may be a vector or a matrix mapping where a further factor affecting the mapping look-up is an additional parameter such as received signal strength. The values in the look-up table for mapping a metric to a bit error rate are preferably generated through simulations at a variety of signal-to-noise ratios and different environmental conditions as was described previously.

At block 108, the bit error rate estimate is provided to network 20. Alternatively, a plurality of bit error rate estimates may be generated which estimates are then averaged and the average bit rate estimate is provided to the network at block 108. At block 110, network 20, for example, through MSTO 28, determines whether a handover should be initiated of the connection between mobile terminal 22 and base station 26 to a different base station or other corrective action should be taken if the bit error rate estimate violates a network criteria.

The present invention provides an estimate of bit error rate for both high and low error rate conditions. The present invention further provides flexibility in averaging the bit error rate estimate over various time periods and based on traffic or control frames. Finally, as the present invention incorporates hardware/code which are already found in the decoder circuitry of the mobile terminal, there is little increase in complexity of the terminal. As a result, lower cost and power consumption may be provided.

The present invention has been described above with respect to FIG. 7 with reference to flowcharts illustrating the operation of the present invention. It will be understood that each block of the flowchart illustrations, and combinations of blocks in the flowchart illustrations, can be implemented by computer program instructions. These program instructions may be provided to a processor to produce a machine, such that the instructions which execute on the processor create means for implementing the functions specified in the flowchart block or blocks. The computer program instructions may be executed by a processor to cause a series of operational steps to be performed by the processor to produce a computer implemented process such that the instructions which execute on the processor provide steps for implementing the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based systems which perform the specified functions or steps, or combinations of special purpose hardware and computer instructions.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for estimating a received signal quality for a communication channel comprising the steps of:
    convolutionally encoding a data frame;
    transmitting the encoded data frame over the communication channel from a control node to the receiver;
    receiving the transmitted data frame at the receiver;
    decoding the received data frame to provide an estimate of the transmitted data frame and an associated final decision metric of at least a portion of a decoder bit path selected for the data frame;
    mapping the final decision metric at the receiver to provide the received signal quality estimate;
    providing the received signal quality estimate to the control node; and
    determining at the control node whether a corrective action should be taken prior to transmission of a subsequently transmitted data frame from the control node to the receiver based on the received signal quality estimate.

2. The method of claim 1 wherein the received signal quality estimate is a bit error rate estimate.

3. The method of claim 2 wherein the communication channel is a radio communication channel and wherein the control node is a terrestrial base station and wherein the corrective action comprises selecting a different communication channel for a subsequently transmitted data frame based on the bit error rate estimate.

4. The method of claim 2 wherein the communication channel is a radio communication channel and wherein the control node is a terminal.

5. The method of claim 2 wherein the communication channel is a radio communication channel and wherein the control node is a satellite station and wherein the corrective action comprises selecting a different communication channel for a subsequently transmitted data frame based on the bit error rate estimate.

6. A method for estimating a received signal quality for a communication channel comprising the steps of:
    convolutionally encoding a plurality of data frames;
    transmitting the plurality of encoded data frames over the communication channel;
    receiving the plurality of transmitted data frames:
    decoding the plurality of received data frame to provide estimates of the transmitted data frame and an associated plurality of final decision metrics;
    averaging the plurality of associated final decision metrics; and
    mapping the averaged plurality of associated final decision metrics to provide the bit error rate estimate.

7. The method of claim 5 wherein said averaging step comprises the step of averaging a plurality of associated final decision metrics using at least one of a moving average routine, an autoregressive routine or a combination autoregressive moving average routine.

8. A method for estimating a received signal quality for a communication channel comprising the steps of:
    convolutionally encoding a plurality of data frames;
    transmitting the plurality of encoded data frames over the communication channel;
    receiving the plurality of transmitted data frames;
    decoding the plurality of received data frame to provide estimates of the transmitted data frame and an associated plurality of final decision metrics;
    mapping ones of the plurality of final decision metrics to provide a plurality of bit error estimates;
    averaging the plurality of bit error estimates to provide an averaged bit error estimate; and
    providing the averaged bit error estimate to a control node associated with the communication channel.

9. The method of claim 8 wherein said averaging step comprises the step of averaging the plurality of bit error estimates using at least one of a moving average routine, an autoregressive routine or a combination autoregressive moving average routine.

10. A method for estimating a received signal quality for a communication channel comprising the steps of:
    convolutionally encoding a data frame;
    transmitting the encoded data frame over the communication channel;
    receiving the transmitted data frame;
    decoding the received data frame to provide an estimate of the transmitted data frame and an associated final decision metric;
    convolutionally encoding a control frame;
    transmitting the encoded control frame over the communication channel;

receiving the transmitted control frame;

decoding the received control frame to provide an estimate of the transmitted control frame and a second associated final decision metric of at least a portion a decoder bit path selected for the control frame;

determining which of said final decision metric associated with the voice frame and said second final decision metric indicates a better match; and mapping the better match final decision metric to provide a bit error rate estimate.

11. A communication system for communicating over a communication channel comprising:

means for convolutionally encoding a data frame;

means for transmitting the encoded data frame over the communication channel;

means for receiving a transmitted data frame;

means for decoding the received data frame to provide an estimate of the transmitted data frame and an associated final decision metric of at least a portion of a decoder bit path selected for the data frame;

means for mapping the final decision metric to provide a bit error rate estimate;

means for providing the bit error rate estimate to a control node over the communication channel; and means for determining whether a corrective action should be taken prior to transmission of a subsequently transmitted encoded data frame based on the bit error rate estimate.

12. The communication system of claim 11 further comprising means for storing a plurality of associated final decision metrics and wherein said means for mapping comprises means for averaging the plurality of associated final decision metrics and mapping the averaged plurality of associated final decision metrics to provide the bit error rate estimate.

13. The communication system of claim 11 further comprising:

means for averaging a plurality of bit error rate estimates from a plurality of data frames to provide the bit error rate estimate.

14. The communication system of claim 11 wherein the communication channel is a radio communication channel and wherein the control node is a base station.

15. The communication system of claim 11 wherein the communication channel is a radio communication channel and wherein the control node is a satellite station.

16. A communication system comprising:

a receiver device including:
 a receiver which receives a data frame over a communication channel;
 a convolutional decoder coupled to said receiver, said convolutional decoder providing an estimate of transmitted data from the received data frame and an associated final decision metric for the estimate of transmitted data;
 a bit error rate estimation circuit coupled to the decoder that provides an estimate of bit error rate based on the final decision metric;
 a transmitter that transmits the estimate of bit error rate over the
 communication channel; and a control node including:
 a transmitter that transmits the data frame over the communication channel;
 a receiver that receives the estimate of bit error rate over the communication channel;
 a controller that determines whether a corrective action should be taken prior to transmission of a subsequently transmitted data frame from the control node to the receiver device based on the estimate of bit error rate.

17. The communication system of claim 16 wherein the convolutional decoder is a Viterbi decoder.

18. The communication system of claim 17 wherein the bit error rate estimation circuit further comprises means for determining if the final decision metric is associated with an estimate of transmitted data containing an error indication and means for basing the estimate of bit error rate on a final decision metric of a second decoder bit path associated with an estimate of transmitted data having no error indication.

19. The communication system of claim 14 wherein the convolutional decoder includes means for considering a plurality of paths to provide a plurality of associated final decision metrics and wherein said means for basing the estimate of bit error rate on a final decision metric associated with an estimate of transmitted data having no error indication comprises means for selecting one of said plurality of associated final decision metrics as the final decision metric on which the estimate of bit error rate is based.

20. The communication system of claim 16 wherein the bit error rate estimation circuit comprises:

a memory that stores reference values that convert the associated final decision metric to a corresponding bit error rate estimate for the communication channel; and a controller for mapping the associated final decision metric to the stored reference values to provide an estimate of bit error rate.

21. The communication system of claim 20 wherein the reference values are predefined and stored in the memory and wherein the memory is a non-volatile memory.

22. The communication system of claim 16 wherein the bit error rate estimation circuit comprises means for calculating the bit error estimate by evaluating a predetermined function having the associated final decision metric as an input.

23. The communication system of claim 16 wherein the communication channel is a radio communication channel.

24. The communication system of claim 16 wherein the receiver comprises a mobile terminal and the control node comprises part of a cellular radio communication network and wherein the corrective action comprises selecting a different communication channel for a subsequently transmitted data frame based on the bit error rate estimate.

* * * * *

UNITED STATES PATENT AND TRADEMARK OFFICE
CERTIFICATE OF CORRECTION

PATENT NO.   : 6,141,388  
DATED        : October 31, 2000  
INVENTOR(S)  : Servais et al.

Page 1 of 1

It is certified that error appears in the above-identified patent and that said Letters Patent is hereby corrected as shown below:

Title page,  
Item [54], the title should read as follows:  
-- RECEIVED SIGNAL QUALITY DETERMINATION METHODS AND SYSTEMS FOR CONVOLUTIONALLY ENCODED COMMUNICATION CHANNES --

Column 12,  
Line 30, should read as follows:  
-- 7.    The method of claim 6 wherein said averaging step --

Column 14,  
Line 25, should read as follows:  
-- 19.   The communication system of claim 18 wherein the --

Signed and Sealed this

Sixth Day of August, 2002

Attest:

Attesting Officer

JAMES E. ROGAN  
*Director of the United States Patent and Trademark Office*